United States Patent
Abdeddaim et al.

(10) Patent No.: US 10,816,620 B2
(45) Date of Patent: Oct. 27, 2020

(54) METHOD FOR CONTROLLING THE DISTRIBUTION OF THE RF MAGNETIC FIELD IN A MAGNETIC RESONANCE IMAGING SYSTEM

(71) Applicants: UNIVERSITÉD'AIX-MARSEILLE, Marseilles (FR); CENTRE NATIONAL DE LA RECHERCHE SCIENTIFIQUE, Paris (FR); ECOLE CENTRALE DE MARSEILLE, Marseilles (FR); COMMISSARIAT À L'ENERGIE ATOMIQUE ET AUX ENERGIES ALTERNATIVES, Paris (FR)

(72) Inventors: Redha Abdeddaim, Marseilles (FR); Stefan Enoch, Marseilles (FR); Pierre Sabouroux, Marseilles (FR); Gérard Henri Jacques Tayeb, Marseilles (FR); Nicolas Bonod, La Londe les Maures (FR); Alexandre Christian Vignaud, Paris (FR); Benoit Larrat, Paris (FR); Elodie Virginia Emilia Georget, Marseilles (FR); Lisa Marie Anna Leroi, Besse-sur-Issole (FR)

(73) Assignees: UNIVERSITE D'AIX-MARSEILLE, Marseilles (FR); CENTRE NATIONAL DE LA RECHERCHE SCIENTIFIQUE, Paris (FR); ECOLE CENTRALE DE MARSEILLE, Marseilles (FR); COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 89 days.

(21) Appl. No.: 16/090,460

(22) PCT Filed: Mar. 29, 2017

(86) PCT No.: PCT/FR2017/050722
§ 371 (c)(1),
(2) Date: Oct. 1, 2018

(87) PCT Pub. No.: WO2017/198914
PCT Pub. Date: Nov. 23, 2017

(65) Prior Publication Data
US 2019/0120917 A1   Apr. 25, 2019

(30) Foreign Application Priority Data

Mar. 29, 2016 (FR) ..................................... 16 52700

(51) Int. Cl.
*G01R 33/34* (2006.01)
*G01R 33/36* (2006.01)
*G01R 33/565* (2006.01)

(52) U.S. Cl.
CPC . *G01R 33/34076* (2013.01); *G01R 33/34007* (2013.01); *G01R 33/3607* (2013.01); *G01R 33/3642* (2013.01); *G01R 33/5659* (2013.01)

(58) Field of Classification Search
CPC ........ G01R 33/34076; G01R 33/34007; G01R 33/3607; G01R 33/3642; G01R 33/5659
(Continued)

(56) References Cited

U.S. PATENT DOCUMENTS 5,998,999 A * 12/1999 Richard ........... G01R 33/34046
324/318
6,169,401 B1 * 1/2001 Fujita ................. G01R 33/3678
324/318
(Continued)

FOREIGN PATENT DOCUMENTS

| EP | 2757385 A1 | 7/2014 |
|---|---|---|
| WO | 2008/100546 A1 | 8/2008 |
| WO | 2015/044554 A1 | 4/2015 |

OTHER PUBLICATIONS

Sep. 12, 2017 International Search Report issued in International Patent Application No. PCT/FR2017/050722.
(Continued)

*Primary Examiner* — Christopher P McAndrew
(74) *Attorney, Agent, or Firm* — Oliff PLC

(57) ABSTRACT

A method for controlling the distribution of the RF magnetic field in a magnetic resonance imaging system, having steps of: placing a cage coil in a permanent magnet supplying a permanent magnetic field along a first axis, and supplying an RF signal to the cage coil in order for the coil to generate an
(Continued)

RF magnetic field rotating in a plane that runs perpendicular to the first axis; and putting in place an electromagnetic resonator, the resonance mode of which is excited by the rotating magnetic field, the resonator being placed in a position inside or outside the cage coil and at a distance from a region to be analyzed of an object to be placed in the cage coil, the resonance mode and the position of the resonator in relation to the volumetric antenna being suitable for adjusting the intensity of the rotating magnetic field in an area of the region to be analyzed.

20 Claims, 13 Drawing Sheets

(58) Field of Classification Search
USPC ........................................................ 324/309
See application file for complete search history.

(56) References Cited

U.S. PATENT DOCUMENTS

| | | | | |
|---|---|---|---|---|
| 8,421,462 | B2* | 4/2013 | Zhai | G01R 33/422 |
| | | | | 324/318 |
| 8,947,084 | B2* | 2/2015 | Habara | G01R 33/34046 |
| | | | | 324/307 |
| 9,072,451 | B2* | 7/2015 | Benlloch Baviera | ....................... |
| | | | | H01L 27/14627 |
| 9,182,463 | B2* | 11/2015 | Habara | G01R 33/34046 |
| 9,244,141 | B2* | 1/2016 | Greim | G01R 33/3685 |
| 9,274,189 | B2* | 3/2016 | Soutome | G01R 33/34046 |
| 2014/0058250 | A1 | 2/2014 | Du et al. | |
| 2014/0239953 | A1* | 8/2014 | Luong | G01R 33/365 |
| | | | | 324/322 |
| 2014/0354279 | A1* | 12/2014 | Dumoulin | A61B 5/0046 |
| | | | | 324/318 |
| 2015/0051153 | A1* | 2/2015 | Reshetnyak | A61K 33/24 |
| | | | | 514/19.2 |
| 2015/0102813 | A1* | 4/2015 | Dumoulin | G01R 33/3852 |
| | | | | 324/322 |
| 2016/0077168 | A1* | 3/2016 | Teklemariam | G01N 24/08 |
| | | | | 324/313 |

OTHER PUBLICATIONS

Jouvaud et al.; "Volume coil based on hybridized resonators for magnetic resonance imaging"; Applied Physics Letters 108; pp. 023503-1-023503-5; Published Jan. 12, 2016.

Wang et al.; "Homogenization in MRI by Multilayer Coupled Coils"; IEEE Transactions on Medical Imaging, vol. 28, No. 4, pp. 551-553; Apr. 2009.

* cited by examiner

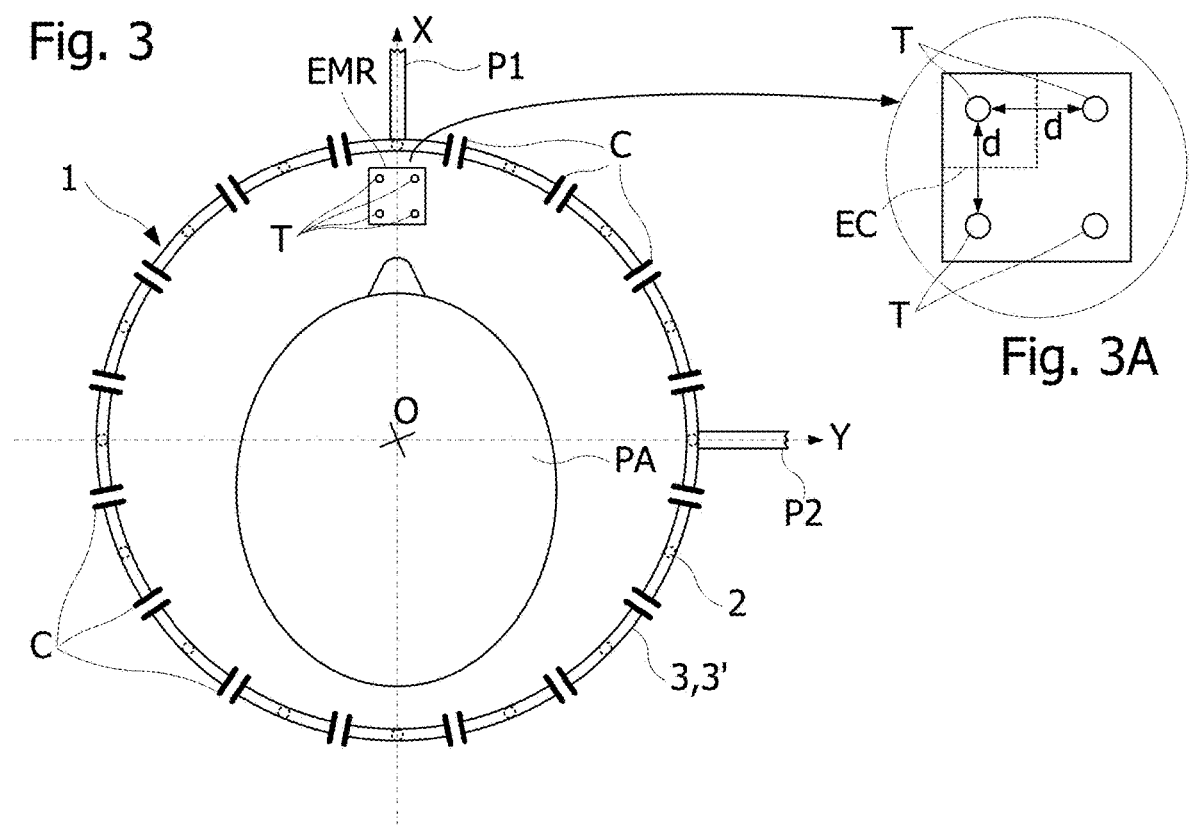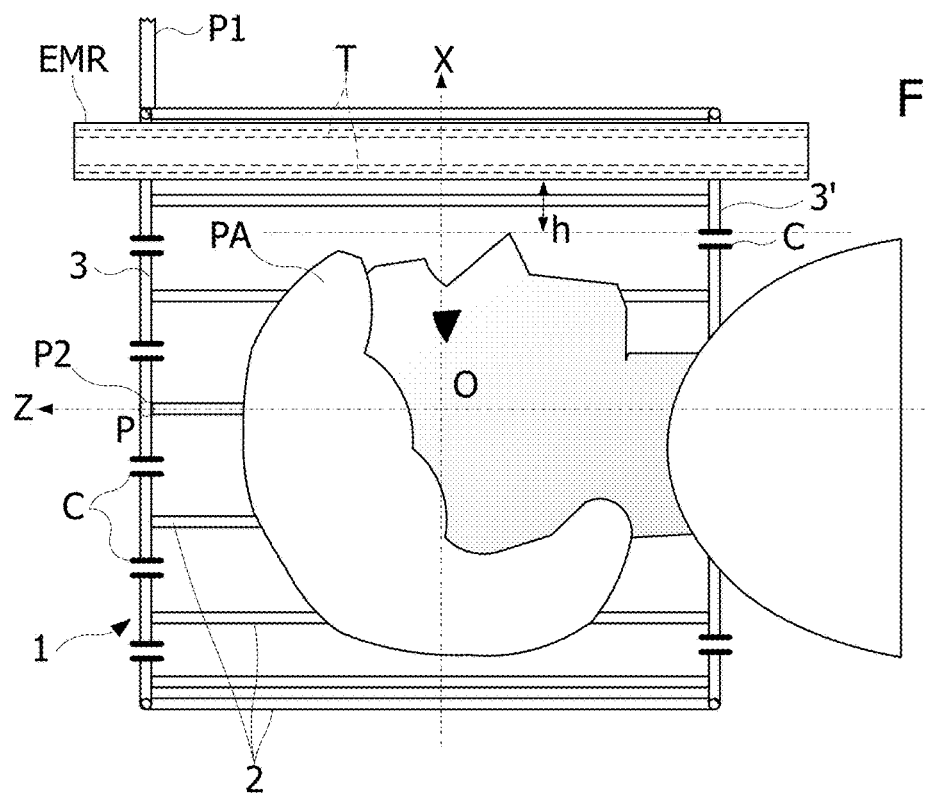

METHOD FOR CONTROLLING THE DISTRIBUTION OF THE RF MAGNETIC FIELD IN A MAGNETIC RESONANCE IMAGING SYSTEM

FIELD

The present invention relates to Nuclear Magnetic Resonance (NMR) devices, as well as their applications such as Magnetic Resonance Imaging (MRI) for humans or animals, and Magnetic Resonance Spectroscopy (MRS).

BACKGROUND

The invention is in particular applicable to high and ultra-high frequency coils having at least one transmission channel that may in some cases be used for receiving the signal. Such coils are used for the examination of all or part of the body of a patient in NMR devices and in particular in MRI imaging devices. These devices excite the magnetic spins of certain atoms at their Larmor frequency, for example the hydrogen atoms, in the sample placed inside the coil, and collect a radiofrequency signal resulting from a relaxation phenomenon.

MRI devices include a magnet producing a static longitudinal magnetic field B0, and coils having radiating elements, of variable shapes, achieving either a transmitter function or a relaxation signal receiver function, or both functions alternately. These coils are arranged around the body region to be analyzed. In transmitter operation, the coils are supplied with an electrical excitation that causes them to produce a radiofrequency (RF) electromagnetic field having a transverse magnetic component B1, orthogonal to the B0 field. In receiving operation, they sense an RF signal having a precession or relaxation resonance frequency (also called Larmor frequency) of the nuclei of the atoms that are within the magnetic field B0 and that have been momentarily subjected to the magnetic field B1.

Under the effect of the static magnetic field B0, the spin magnetic moments of the nuclei of hydrogen atoms align in a direction parallel to the magnetic field B0.

Under the effect of a pulse of the RF magnetic field B1 oscillating or rotating at the Larmor frequency, around the direction of the field B0, the magnetic spin moments of the atomic nuclei, for example of hydrogen, deviate progressively from the direction of the field B0 to reach a flip angle FA with respect to this direction by describing a movement called "precession". The RF field B1 thus flips the magnetic spin moments by an angle FA with respect to the direction of the field B0.

When the excitation produced by the field B1 is interrupted, the magnetic spin moments, which have deviated from their initial axis, gradually return towards their equilibrium orientation, that is to say the direction of the field B0, without ceasing to rotate around this direction. This return to balance is called relaxation. It is possible to measure this rotational movement of the spins in the form of a very low RF field sensed by the coil, the sensed RF field having the same frequency as the transmitted RF field, that is to say the Larmor resonance frequency.

Generally, the coils used for the examination of a body region, in particular the head, operate in near magnetic field, and are therefore placed near the part of the body to be analyzed. It turns out, with this type of coil, that the part of the body near the coil reacts to the RF field in the vicinity of the coil. In particular, the human head has electromagnetic characteristics that can generate artifacts.

Generally, the magnetic field intensities used in medical imaging for B0 are between 0.1 and 3 Tesla. At these magnetic field intensities, the wavelength associated with the B1 field, corresponding to the Larmor frequency for hydrogen, remains large compared to the region to be analyzed. Artifacts tend to appear when this condition is no longer true, that is, when the region to be analyzed has large dimensions or when the wavelength associated with the field B1 is decreased. By way of example, for a magnetic field B0 of 1.5 Tesla, the corresponding Larmor frequency for hydrogen is 64 MHz, i.e. a wavelength of about 53 cm in water. For a magnetic field B0 of 3 Tesla, this frequency is 128 MHz, yielding a wavelength of about 26 cm in water. At 7 T, the Larmor frequency reaches about 300 MHz, which corresponds to a wavelength of about 11 cm in water. Up to 128 MHz, the coils used have a resonant cavity structure. This type of coil, commonly called "bird cage" or TEM (Transverse Electric and Magnetic) includes:

A set of bars forming transmission lines coupled together by capacitors distributed along two parallel rings at the ends of the bars, creating a resonance mode, and Two or four RF supply ports interposed between the set of transmission lines and a shielding, for producing the radio frequency excitation of the resonant cavity and detecting the NMR RF signals. A shielding may surround the set of transmission lines. Thus, a coil separates an internal volume from an external volume.

Known coils have the drawback of not functioning properly at high magnetic field values, typically above 3 Tesla, corresponding to a Larmor frequency of the order of 128 MHz, for brain imaging. Indeed, up to 3 Tesla, the corresponding Larmor frequency remains low and the homogeneity defects of the field B1 in the object to be analyzed remain tolerable, which makes it possible to obtain an exploitable image of the studied region. However, artifacts may appear at these magnetic field values with large organs such as the pelvis.

Yet, it is desirable to increase the signal-to-noise ratio of the MRI signals by working with more intense magnetic fields, and thus at higher Larmor frequencies. However, to increase this frequency, the central conductors of the transmission lines of the coil should typically be completely removed which causes radiation losses, as well as a poor homogeneity of the field B1 produced. Beyond 128 MHz, bird cage coils, operating in quadrature mode, show their limit in terms of homogeneity of the distribution of the magnetic field B1 in the region to be analyzed. As a result, some areas of the region to be analyzed are insufficiently excited, leading to significant artifacts in the resulting image. It turns out that these coils are practically unusable at higher magnetic field values of B0, that is to say greater than 3 Tesla. However, it is necessary, particularly in the context of medical imaging, to obtain a qualitative image faithfully reflecting the nature of the tissues of the subject analyzed.

Phased array coils have been developed for frequencies above 128 MHz. Such coils include a plurality of resonators, generally between 8 and 32, used as emitters and receivers, and which are distributed around the region to be analyzed. Each resonator has a specific control channel for transmitting and receiving the RF signal. Each resonator thus makes it possible to produce an image of an area facing the resonator. The different images are then combined by algorithms to form the final image. This type of phased array coil requires controlling each resonator through its own channel with an appropriate amplitude and phase, by means of a power amplifier for spatially controlling the MRI excitation of protons around the region to be analyzed. This type of coil associated with an active control of the homogeneity of the field B1, requires adjustments for tuning and impedance matching of each channel, which are difficult to achieve. The structure of these coils and their use are complex, which entails high costs of installation and use.

It has also been proposed to arrange in the coil one or more cushions formed of a pocket filled with a high dielectric constant material, typically of the order of 150, in order to passively correct distortions of the field B1 appearing at higher Larmor frequencies (refs. [1], [2], [3]). Each cushion enables modification of the distribution of the field in the coil. The materials used may be based on titanium oxide powder, such as $CaTiO_3$ (ref [1]) or $BaTiO_3$ (ref [4]), mixed in deionized water or water with a high proportion of deuterium. It has also been proposed to use pads of PZT (lead and zirconium titanate) (ref. [5]). However, none of these materials is really satisfactory in the context of medical use. To have a sufficient effect on the distribution of the field, they should be bulky and be placed against the body of the patient. The comfort of the patient is thus affected. In addition, these materials generally have a relatively high cost and wear rapidly. Moreover, some materials such as $BaTiO_3$ are very toxic.

It is therefore desirable to obtain a field B1 in a region of an object to be analyzed, which has a homogeneous distribution while using a conventional cage coil, that is to say without individually controlled active resonators. It is also desirable to adjust the distribution of the field in the analyzed region, according to the nature of the latter, in order to obtain a homogeneous distribution of the field B1, or on the contrary, in order to avoid the presence of the field B1 in certain areas of the region to be analyzed. It is desirable to achieve this result without using a high dielectric constant material. It is also desirable to avoid direct contact of material against the body of the patient to be analyzed.

SUMMARY

Embodiments provide a method of controlling the distribution of a radiofrequency magnetic field in a magnetic resonance imaging system, comprising steps of: disposing a cage coil in a permanent magnet providing a permanent magnetic field along a first axis, supplying the cage coil with a radiofrequency signal so that it generates a radiofrequency magnetic field rotating in a plane perpendicular to the first axis, and placing an electromagnetic resonator having a resonance mode excited by the rotating magnetic field, the resonator being electrically isolated from the cage coil, at a position inside or outside the cage coil and at a distance from a region to be analyzed of an object to be arranged in the cage coil, the resonance mode and the position of the resonator relative to the cage coil being adapted to adjust the intensity of the rotating magnetic field in an area of the region to be analyzed.

According to an embodiment, the resonance mode of the resonator is adapted by changing the structure, geometry or size of the resonator, or the nature of the materials forming the resonator.

According to an embodiment, the resonator is configured to have a plurality of resonance modes.

According to an embodiment, the resonator has one of the following configurations: the resonator is formed by a single rod arranged parallel to the first axis, the rod being rectilinear or folded so as to form meanders, or folded so as to form a rectangular loop; the resonator comprises a plurality of parallel conductor rods distributed in a matrix configuration, the rods being embedded in a dielectric material and arranged parallel to the first axis and electromagnetically coupled together.

According to an embodiment, the resonance mode of the resonator is adapted by adjusting the length of the resonator along the first axis or by changing the matrix configuration of the rods.

According to an embodiment, the resonator is disposed in front of a supply port of the coil and configured to increase or decrease the rotating magnetic field locally in an area of the region to be analyzed close to the resonator or in an area of the region to be analyzed located opposite the resonator with respect to a center of the region to be analyzed.

According to an embodiment, the method comprises the steps of placing a plurality of electromagnetic resonators, each having a resonance mode excited by the rotating magnetic field, at respective positions inside or outside the cage coil and at said distance from the region to be analyzed, the resonance mode and the position of each of the resonators being adapted to adjust the intensity of the rotating magnetic field in an area of the region to be analyzed.

Embodiments may also relate to a coil system for a magnetic resonance imaging system, comprising: a cage coil comprising a supply port for receiving a radiofrequency signal for generating inside the coil a radiofrequency magnetic field rotating in a plane, and an electromagnetic resonator having a resonance mode excited by the rotating magnetic field, the resonator being electrically isolated from the cage coil and placed at a position inside or outside the cage coil and at a distance from a region to be analyzed of an object placed in the cage coil, the resonance mode and the position of the resonator relative to the cage coil being adapted to adjust the intensity of the rotating magnetic field in an area of the region to be analyzed.

According to an embodiment, the resonator has one of the following configurations: the resonator has a periodic structure formed of a juxtaposition of elementary cells, each elementary cell including at least two different materials; the resonator includes a plurality of parallel conducting rods, distributed in an n×n matrix configuration, n being an integer greater than 0, and embedded in a dielectric material, the resonator being arranged inside or outside the coil so that the rods are perpendicular to the plane; the resonator is formed by a single rod disposed perpendicular to the plane, the rod being rectilinear or folded so as to form meanders, or folded on itself so as to form an elongated loop extending perpendicular to the plane.

According to an embodiment, the coil system comprises a plurality of resonators disposed inside or outside the coil perpendicular to the plane.

According to an embodiment, the resonator comprises 2×2 rods, the rods having a diameter between 0.2 and 1.2 mm, and being spaced apart by 1 to 3 cm, the resonator being located more than 2 cm from the region to be analyzed.

According to an embodiment, the resonator is configured to have a resonance mode centered on a frequency of the rotating magnetic field.

According to an embodiment, the cage coil is a high-pass bird cage comprising 16 bars connecting two rings to each other, each ring segment between two bars of the two rings comprising a capacitor.

Embodiments may also relate to a magnetic resonance imaging system, comprising a cage coil as defined above, arranged in a permanent magnet providing a permanent magnetic field along an axis perpendicular to the plane.

According to an embodiment, the permanent magnetic field produced by the permanent magnet is 7 T, the cage coil comprising bars interconnecting two rings, each ring segment of the two rings between two bars comprising a capacitor, the bars having a length between 23 and 27 cm, the rings of the cage coil having a diameter between 24 and 28 cm, and the capacitors having a capacitance between 2 and 6 pF.

BRIEF DESCRIPTION OF DRAWINGS

Other advantages and features will become more clearly apparent from the following description of particular embodiments of the invention provided for exemplary purposes only and represented in the appended drawings, in which:

FIG. 3 schematically represents a cage coil in axial view, according to an embodiment, FIG. 3A represents a detail in axial cross-section of a resonator placed in the cage coil, according to one embodiment, FIG. 4 schematically shows the cage coil in axial cross-section along a vertical plane, according to one embodiment.

DESCRIPTION OF EMBODIMENTS

Figure 1:
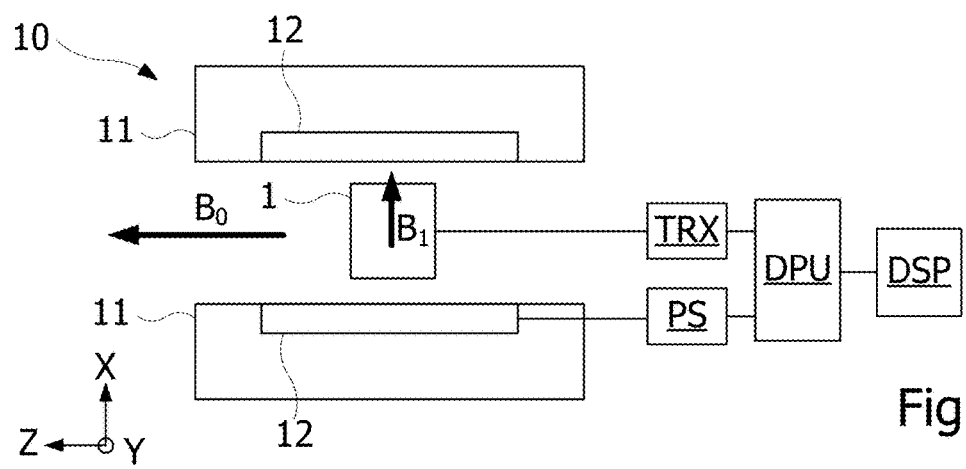
FIG. 1 schematically represents an MRI apparatus.

FIG. 1 shows an MRI apparatus 10. The MRI apparatus comprises a magnet 11, which may be of cylindrical shape, in which a patient to be analyzed is placed. The magnet 11 has a Z axis which is generally oriented horizontally. The magnet 11 comprises a winding 12 which generates inside the magnet 11 a longitudinal magnetic field B0, oriented along the Z axis. The MRI apparatus also comprises a cage coil 1, arranged inside the magnet 11 around a region to be analyzed of an object, such as the body of a patient. The coil 1 is configured to generate an oscillating or rotating RF magnetic field, which is transversal in an XY plane perpendicular to the Z axis. For this purpose, the coil 1 is connected to radio transmission/reception circuits TRX, which supply the coil 1 with an RF signal causing it to generate the field B1. The circuits TRX receive from the coil 1 or from another coil (not shown) nuclear magnetic resonance (NMR) signals that can be used to generate images. The MRI apparatus 10 also includes a power supply circuit PS for supplying the winding 12, and a processing unit DPU that controls the circuits TRX and PS, and which receives the NMR signals supplied by the circuit TRX. The processing unit DPU processes the NMR signals to generate images that can be displayed on a display screen DSP.

Figure 2:
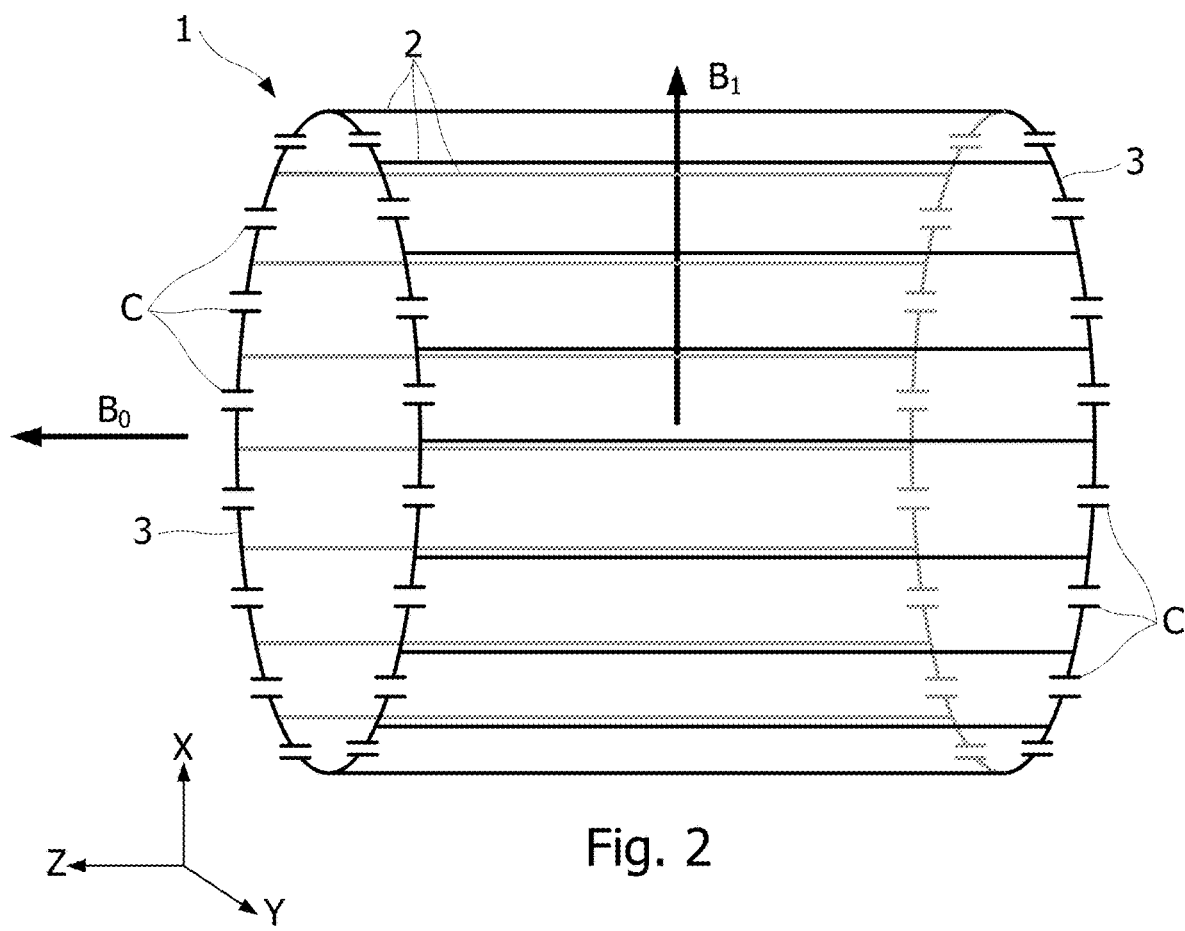
FIG. 2 is a schematic perspective view of an exemplary bird cage coil.

FIGS. 2 to 4 show an example of a high-pass bird cage coil 1 used in the MRI apparatus. The region to be analyzed PA of an object, for example the head of a patient, is disposed in the coil 1. The coil 1 has a generally cylindrical shape having a center O. The coil 1 comprises axial bars 2 extending along the Z axis between two rings 3, 3' located in a plane parallel to the XY plane. The bars 2 are uniformly distributed around the region PA. Each segment of the rings 3, 3' between two bars 2 comprises a capacitor C coupling together two of the bars 2. The coil 1 is powered by two or more ports P1, P2 through which the circuit TRX provides the RF signal. In the example of FIGS. 3 and 4, the ports P1, P2 are arranged on one of the rings 3, the port 1 being disposed on the axis PX, and the port P2 being disposed on the axis PY (the point P being the center of the ring 3), so as to feed the coil in quadrature. In addition, the coil includes 16 bars 2, and therefore 32 capacitors C.

According to an embodiment, one or more electromagnetic resonators are disposed inside or outside the coil 1, to adjust the distribution of the field B1 in the region to be analyzed PA, the resonators being electrically isolated from the coil. For this purpose, each resonator is configured to present an own resonance mode excited by the field B1 generated by the coil 1. Thus, each resonator behaves like a passive secondary coil, under the effect of the field B1. Each resonator EMR is disposed at a minimum distance h from the object to be analyzed.

The structure, the geometry and the position of each resonator EMR with respect to the coil 1 are chosen as a function of the effect to be obtained on the distribution of the field B1 in the coil 1, and therefore as a function of the frequency of the field B1. The effect obtained on the distribution of the field B1 can be a uniformization of the field B1 in the region to be analyzed, an increase or a decrease of the field B1 in the vicinity of the resonator EMR, or an increase or a decrease of the field in an area opposite the resonator with respect to the center O of the region to be analyzed or the coil 1. This last effect, allowing a remote action on the distribution of the field B1, is particularly useful when the space available near the working area is insufficient to house a resonator.

Each resonator EMR may for example be made of a meta-material, and thus have a periodic structure formed by the juxtaposition of elementary cells, also called "meta-atoms". Each elementary cell consists of one or more materials, and has small dimensions relative to the wavelength of the field B1. This condition is considered satisfied if the dimensions of the elementary cells are less than or equal to 50% of the wavelength of the field B1.

In the example of FIGS. 3 and 4, a single resonator EMR is disposed in the coil 1. The resonator EMR has a square section including n×n (n=2 in the example of FIGS. 3 and 4) elementary cells EC distributed in a matrix, each elementary cell having a length equal to the length of the resonator EMR or a fraction thereof, and including a segment of a rod T. It should be noted that the elementary cells forming the resonator can be considered as elementary resonators coupled together. The resonator EMR can thus have several modes of resonance.

FIG. 3A shows a section of the resonator EMR. In the example of FIGS. 3, 3A and 4, the EMR resonator includes four rods T of circular section, oriented along the Z axis, and arranged at the vertices of a square, each rod T being disposed at a distance d from two others of the four rods T. Each rod T can thus be considered as an electric dipole forming a resonator electromagnetically coupled with the other resonators, each formed by one of the other rods T. For this purpose, the rods are distant from each other by less than half the wavelength of the field B1 in the medium of the object to be analyzed (usually water). When the field B0 is 7 T, this wavelength is of the order of 10 cm in water.

In the example of FIGS. 3 and 4, the resonator EMR is disposed in the coil 1 facing the port P1 (between the port P1 and the region to be analyzed PA). By way of example, the resonator includes 4 conductive rods T, for example made of copper, embedded in a dielectric material, such as polystyrene. The rods T may have a diameter between 0.3 and 1.5 mm, and a length between 30 and 90 cm, depending on the desired effect on the distribution of the field B1. The distance d between the rods T may be between 1 and 3 cm. The distance h is between 1.5 cm and 15 cm. In addition, the coil is adapted to receive a human head. For this purpose, it has an internal diameter of 26.5 cm and a length of 25 cm (these dimensions being defined within ±20%), the capacitors C having a capacity of 4 pF, and the Larmor frequency being of the order of 300 MHz. Thus, the distance d between the rods represents for example 3 to 13% of the inside diameter of the coil.

Figure 5A:
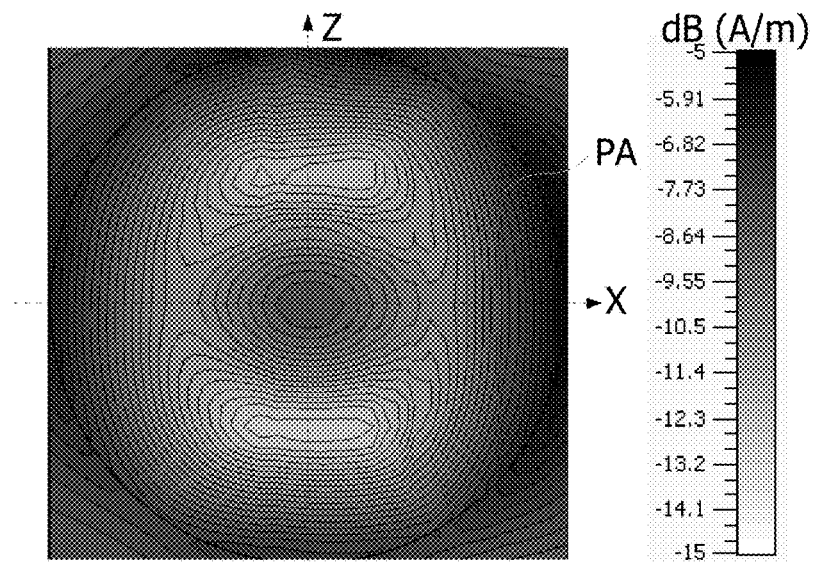
FIGS. 5A to 5E are axial cross-section images along a vertical plane of distribution of the field B1 of an object to be analyzed placed in the cage coil.
Figure 5B:
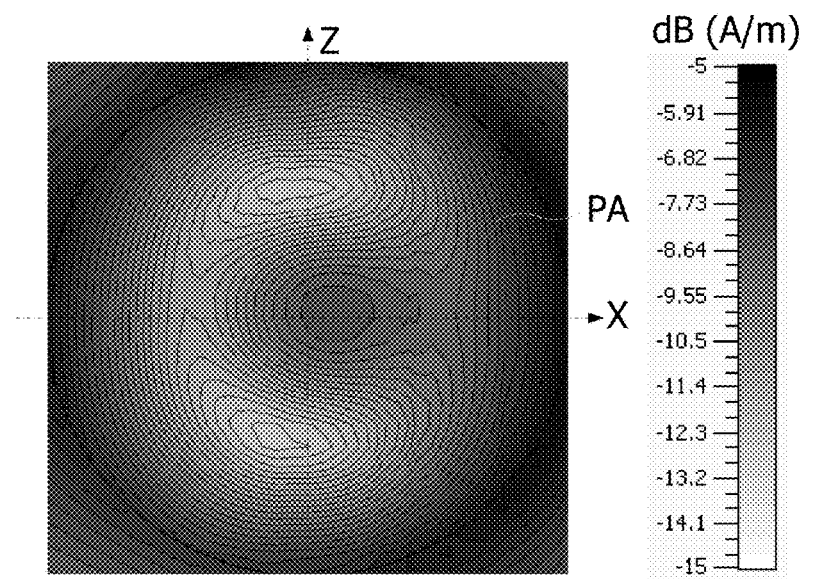
Figure 5C:
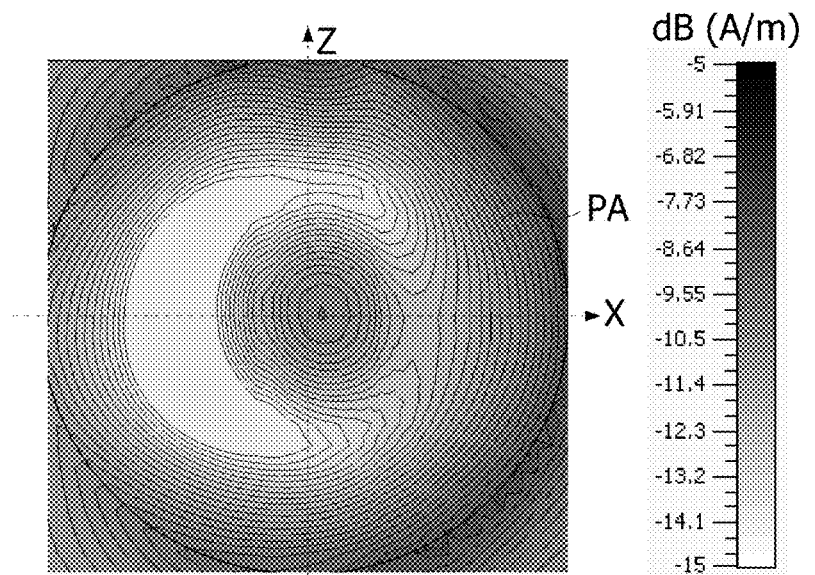
Figure 5D:
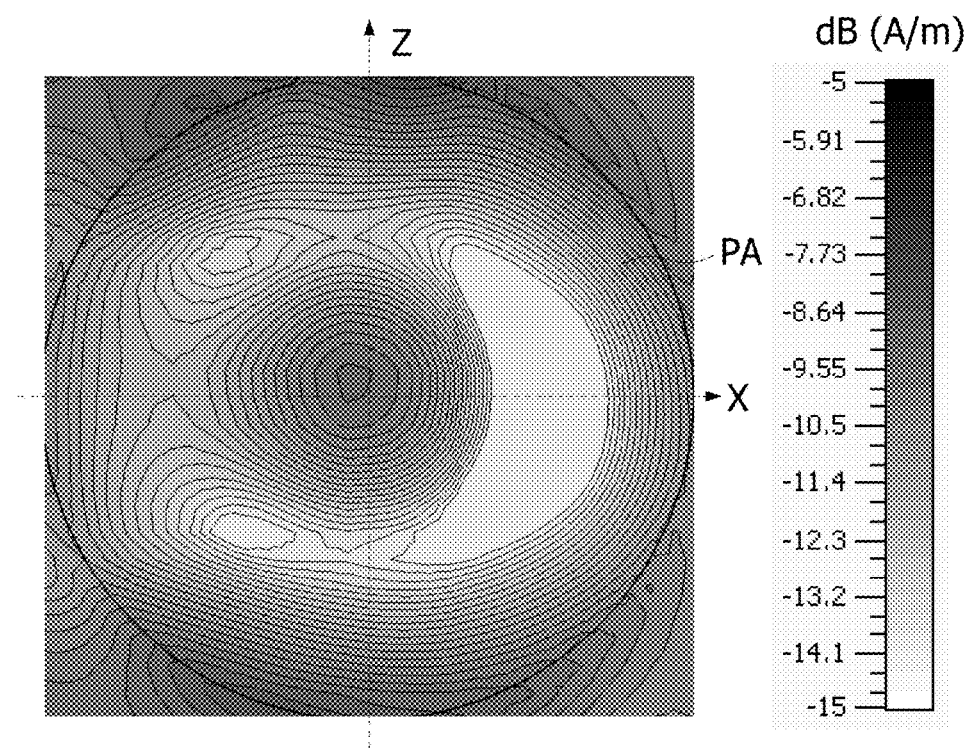
Figure 5E:
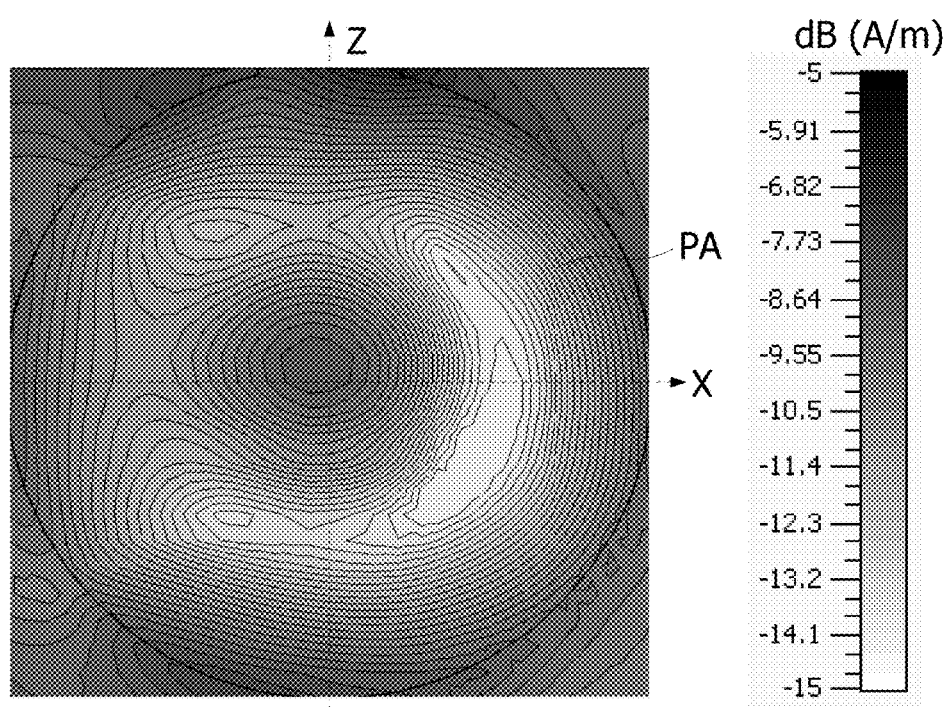

Simulations of the distribution of the field B1 were conducted by placing in the coil 1 an object simulating a human head and having similar electromagnetic properties, and placing to the right of the simulated head along the Z axis a resonator EMR with four rods having the section described above, and having different lengths. These measurements (in dB) are presented in FIGS. 5A to 5E. The measurements of FIG. 5A were obtained without a resonator. The measurements of FIGS. 5B to 5E were obtained with resonator lengths of 40, 50, 60 and 80 cm, respectively. These measurements show that the length of the resonator EMR (along the Z axis) influences the distribution of the field B1 in the region to be analyzed PA. Indeed, the resonator EMR has a resonance mode that depends on its geometry and in particular on its length. Under the conditions of the example above with a diameter of the rods T of 0.5 mm and a distance d between the rods of 2 cm, the distribution of the field B1 is not significantly modified when the length of the resonator EMR is less than 30 cm. When the length of the resonator EMR is between 35 and 45 cm (FIG. 5B), an area of the region PA to be analyzed close to the resonator EMR has an increased value for field B1. Note that in this range of resonator lengths, a resonance mode of the resonator EMR is excited by the field B1. When the length of the resonator EMR is between 45 and 55 cm (FIG. 5C), a very weak field region, at about −10 dB, appears between the center of the region to be analyzed (PA) and the edge of the coil 1, opposite the position of the resonator relative to the center O of the PA region. When the length of the EMR resonator is between 55 and 90 cm (FIGS. 5D and 5E), this very weak field region moves to a zone between the center O of the region PA and the resonator EMR. It can also be observed that by placing the resonator EMR opposite the port P1, the distribution of the component along the X axis (along the axis of the port P1) of the field B1 is significantly modified, while the component along the Y axis (axis of the port P2) of this field undergoes negligible distribution changes.

As a result, the position of the resonator EMR with respect to the coil 1 has an influence on the distribution of the field B1 in the coil. The distribution of the field B1 can also be modified by changing the length of the resonator (along the Z axis). However, this change in length modifies the resonance mode(s) of the resonator EMR. This resonance mode can also be modified by changing the matrix configuration of the rods T (for example by changing the spacing of the rods along the X axis and/or the Y axis), or by changing the diameter of the rods T, or by changing the materials forming the resonator EMR.

Figure 6A:
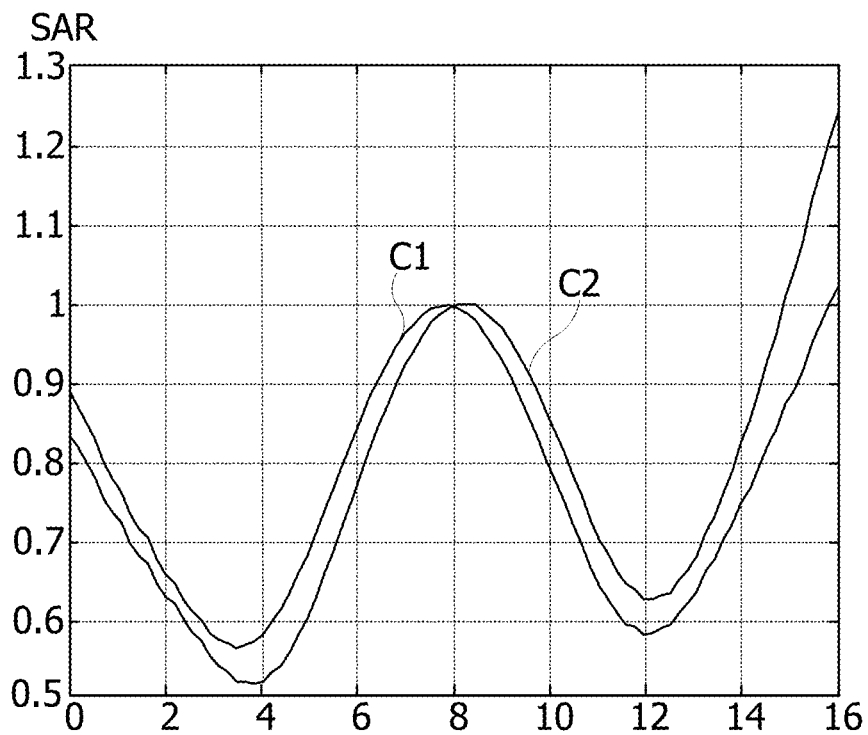
FIG. 6A represents curves of variation of the intensity of the magnetic field B1 along a line OY, with and without a resonator, inside the coil.
Figure 6B:
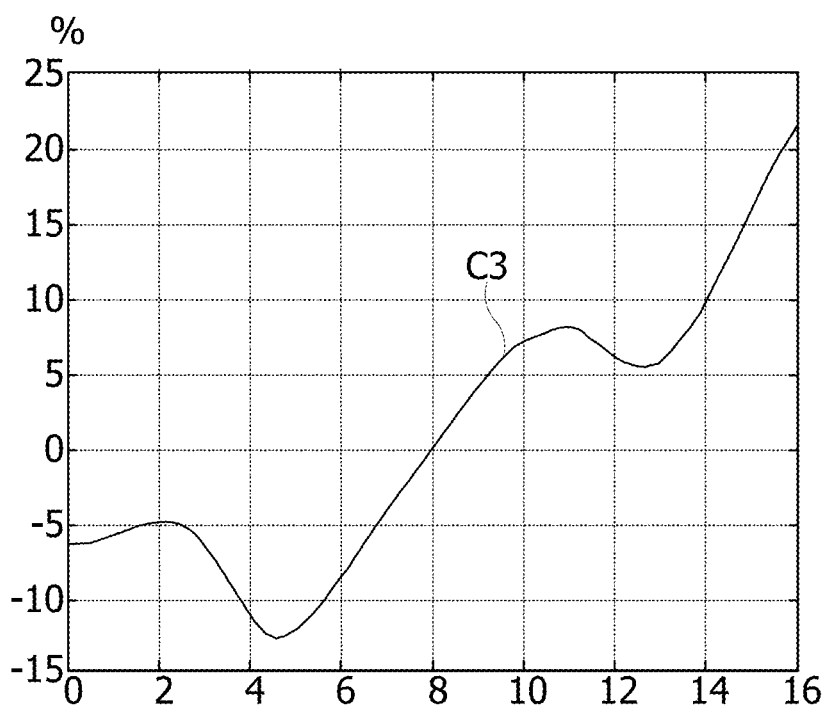
FIG. 6B represents a variation curve of the difference between the two curves of FIG. 6A.

FIG. 6A shows two curves C1, C2 of variation of the intensity of the field B1, along the line OX, respectively without and with the resonator EMR in front of the port P1, the resonator having a length of 40 cm. The curve C2 has been shifted upwards so as to compensate for the decrease in the intensity of the field B1 in the coil 1, due to the presence of the resonator EMR in front of the port P1. FIG. 6B represents a curve C3 obtained by calculating a relative difference in percentage between the curves C1 and C2. Curve C3 shows that the resonator modifies the distribution of the field B1, by increasing it in certain areas by 10%, and up to 22% in the vicinity of the resonator EMR, in the case where the power loss of the field B1, due to the presence of the resonator, has been compensated.

Figure 7A:
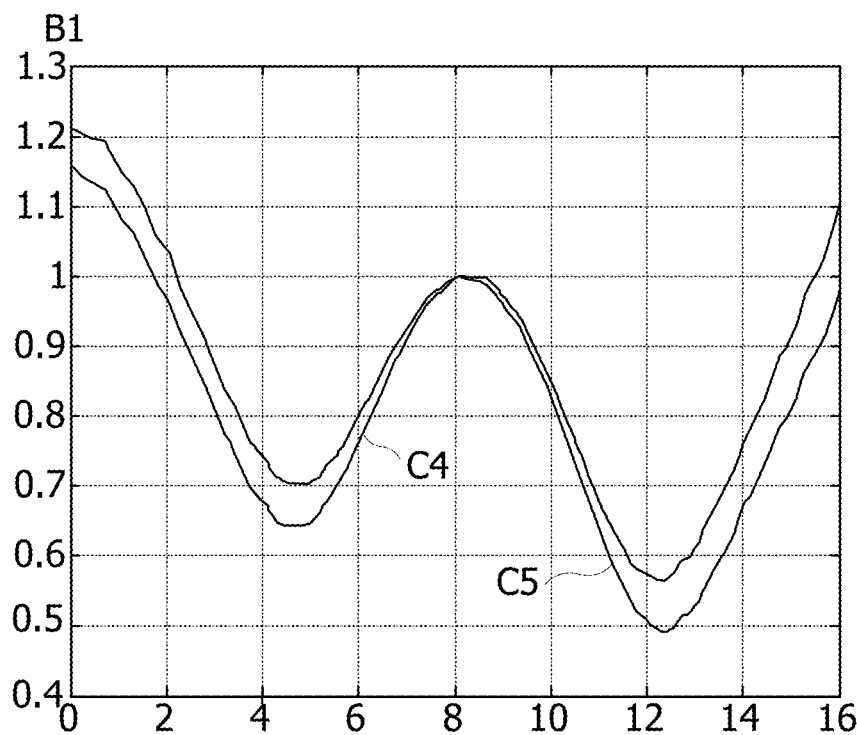
FIG. 7A represents curves of variation of the intensity of the magnetic field B1 along a line OZ inside the coil, with and without a resonator.
Figure 7B:
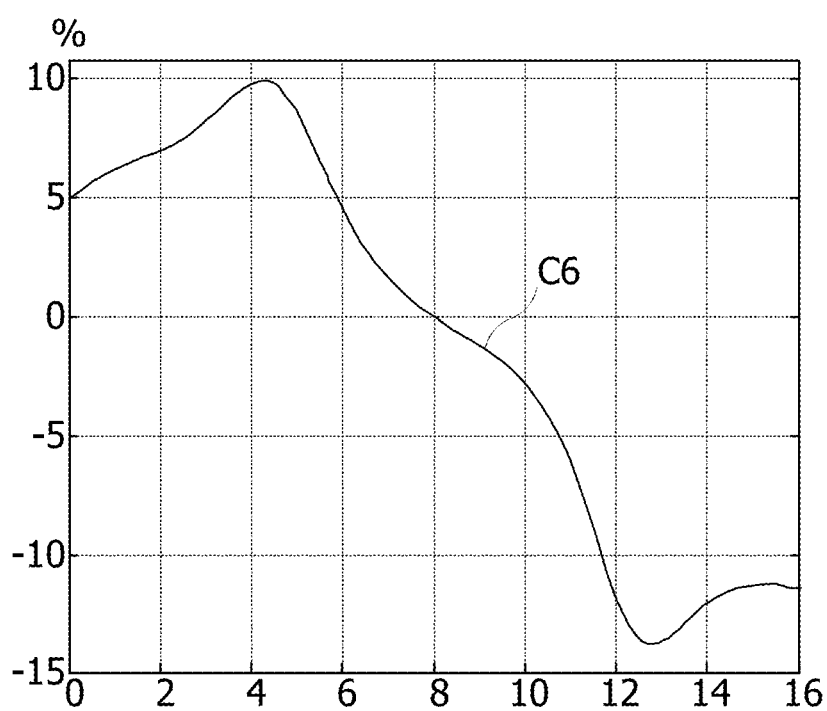
FIG. 7B represents a curve of variation of the difference between the two curves of FIG. 7A, FIGS. 8A, 8B are cross-section images along a vertical plane of the distribution of the field B1 in the cage coil, in the presence of an object to be analyzed placed in the latter, respectively without and with a resonator according to another embodiment, FIGS. 9A, 9B schematically show the cage coil, respectively in axial view and in axial cross-section along a vertical plane, associated with a resonator according to another embodiment.

FIG. 7A represents two curves C4, C5 of variations of the field B1 along the line OZ. FIG. 7B represents a curve C6 of variation of a relative difference in percentage between the curves C4 and C5. The comparison of the curves C4 and C5 reveals that the resonator EMR in front of the port P1 modifies the distribution of the field B1 (±10%) without increasing it in a central zone where it locally has a maximum value.

It can also be observed that the presence of one or more resonators EMR in or around the coil 1 does not significantly increase the Specific Absorption Rate (SAR), which is representative of the energy transmission to the coil region to be analyzed PA, even if a possible loss of power is compensated in the region to be analyzed, resulting from the presence of the EMR resonator in or around the coil 1.

From the foregoing, it is possible to increase or decrease locally the intensity of the field B1 generated by the ports P1, P2, by disposing in the coil 1, or close thereto, one or more resonators having a resonance mode excited at the Larmor frequency (frequency of field B1). Here, "near" means a distance of about one or a few centimeters outward from the coil, this distance being small enough for the resonator to have an influence on the distribution of the field B1 in the coil. Of course, in the case where the coil is surrounded by a shield, the resonator is disposed between the shield and the coil or inside the coil. The position of each resonator is determined according to the areas where the field B1 is to be decreased or increased. It is thus possible to normalize the distribution of the field in the region to be analyzed or, on the contrary, to attenuate the field B1 in an area of the region to be analyzed which must not receive a field. This is the case, for example, of a zone including a metal implant.

It will be apparent to those skilled in the art that the present invention may be subject to various alternative embodiments and various applications. In particular, the invention also applies to a low-pass bird cage coil, that is to say in which the capacitors C are arranged not on the rings 3, 3' but on the bars 2. The invention also applies to a band-pass coil in which capacitors are arranged both on the rings 3, 3' and on the bars 2.

On the other hand, the resonator may have other shapes and be realized in various other ways. Thus, the resonator can be made, for example, by etching a conductive layer deposited on a wafer in an insulating material. The resonator may be in the form of a U-ring or a Split Ring Resonator (SRR), an omega, a Jerusalem cross, platelets, or several such elements coupled together.

Figure 8A:
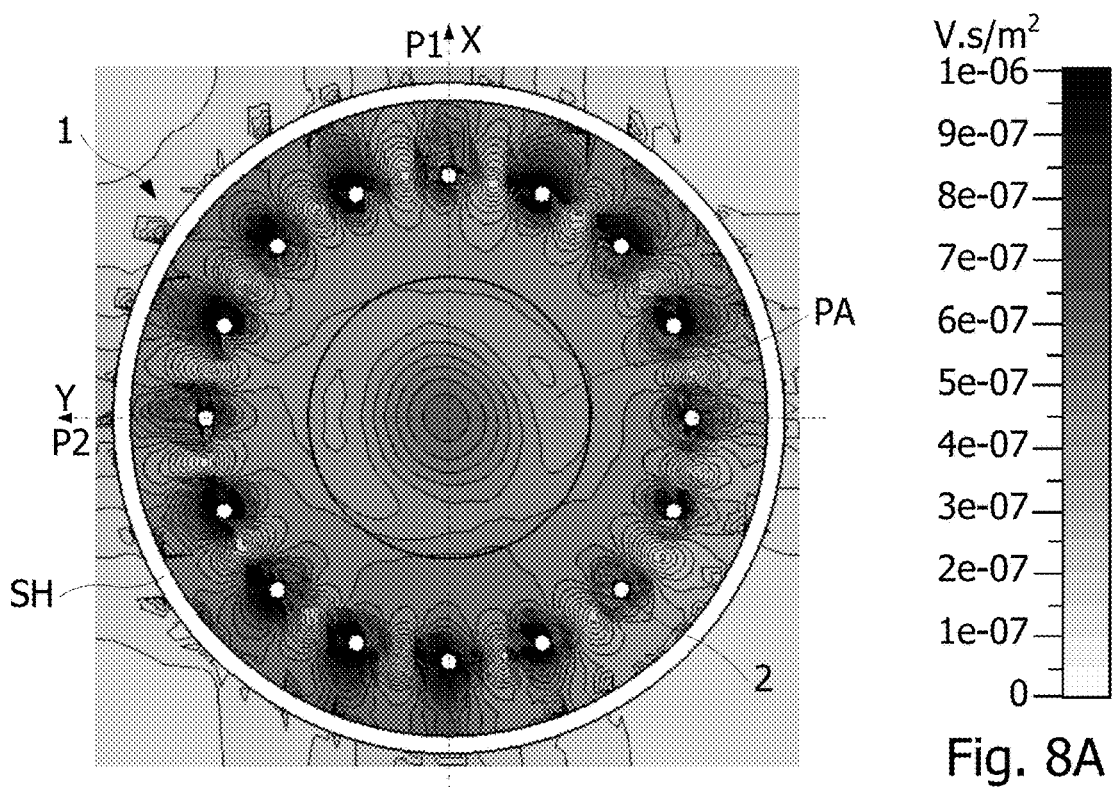

FIG. 8A is an image of the distribution in the cage coil 1 of the component of the B1 field measured to form MRI images, in the presence of an object to be analyzed PA placed therein, in the absence of a resonator. FIG. 8A shows field regions inside the coil 1 along the bars of the coil and decreasing closer to the object to be analyzed. The presence of a relatively intense field can also be observed in a central region of the object to be analyzed PA, that decreases towards the periphery of the object, with a slight increase in the vicinity of the periphery of the object, inside and outside thereof.

Figure 8B:
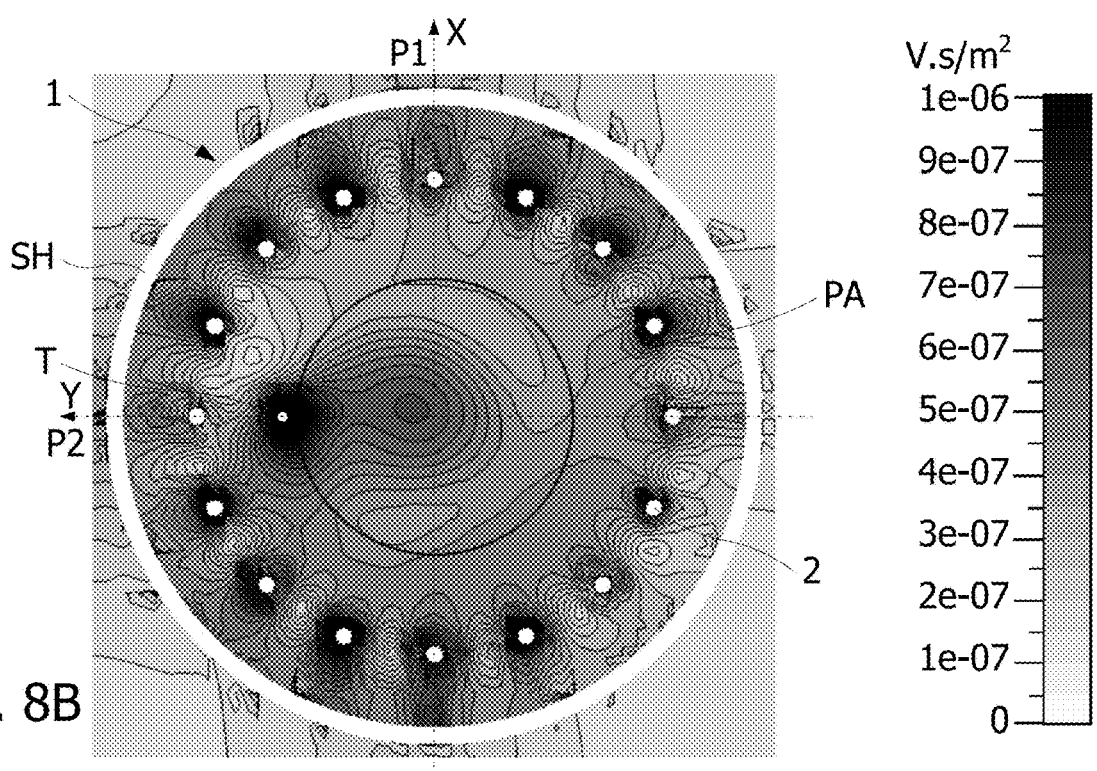

Thus, FIG. 8B represents an image of the distribution of the field B1 in the cage coil 1, in the presence of an object to be analyzed PA placed therein, the coil being associated with a resonator consisting of a single straight rod T placed axially in the coil. With respect to FIG. 8A showing the distribution of the field B1 in the cage coil 1, without a resonator, FIG. 8B shows a local increase of the field B1 around the rod T inside the coil, and in a central region of the object to be analyzed PA. In FIGS. 8A, 8B, the field is measured in V·s/m². In the example of FIG. 8B, the rod has a diameter of 1 mm (±20%) and a length equal to twice the length of the coil (±20%).

Figure 9A:
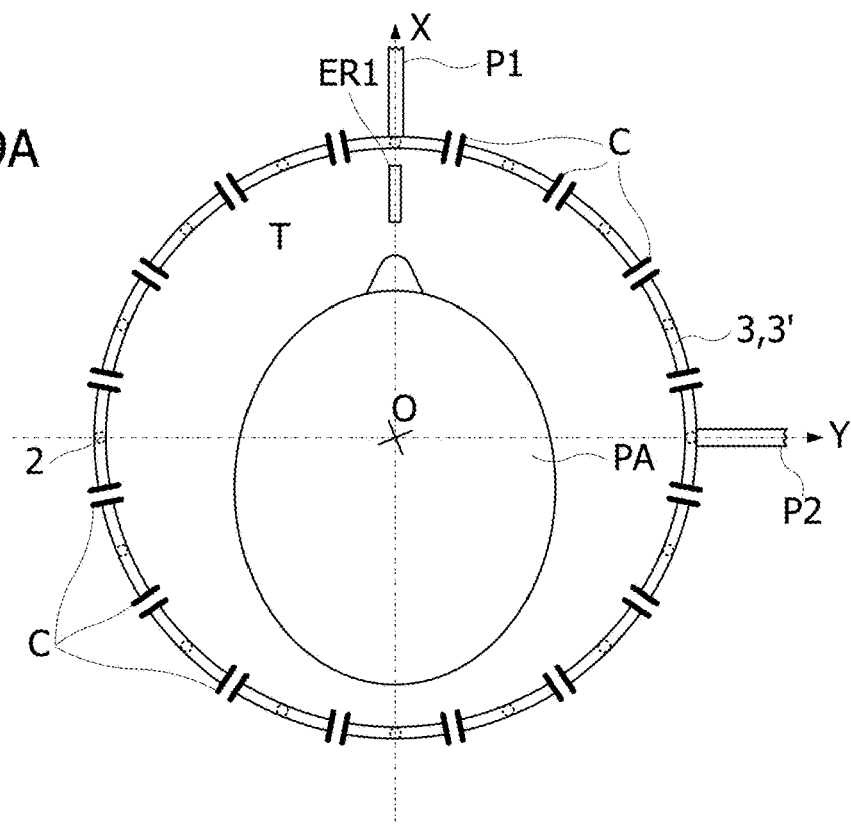
Figure 9B:
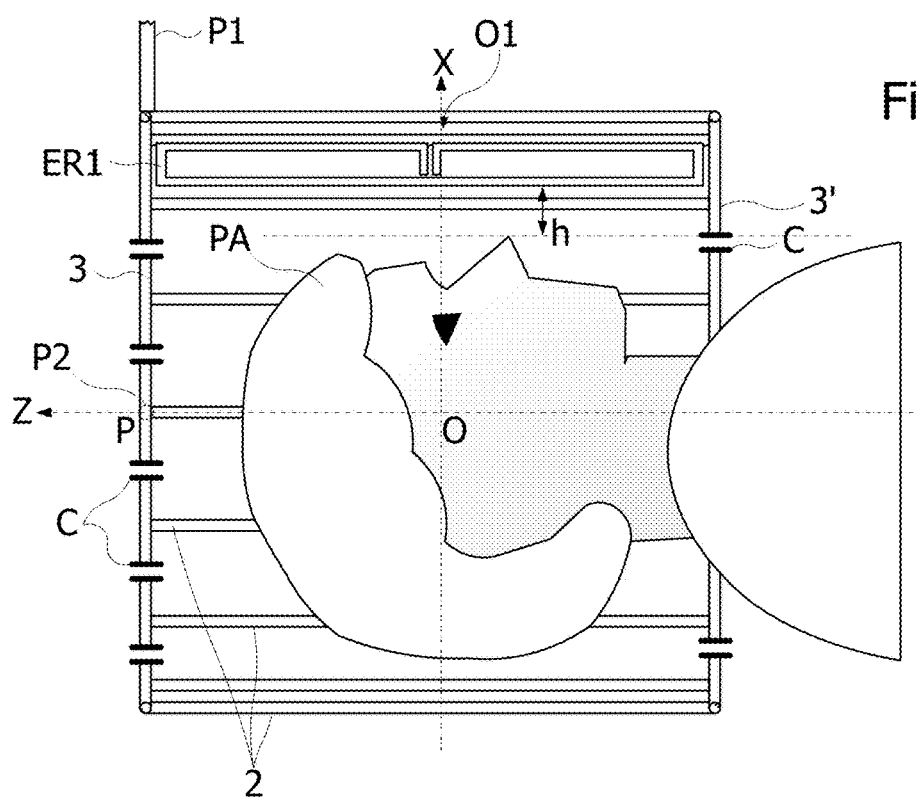

FIGS. 9A, 9B show the cage coil 1 associated with an SRR resonator ER1, in the form of a split ring, having a rectangular shape, the ends of the split ring being folded towards the inside of the ring to form a gap. The resonator ER1 is disposed in the coil 1 in the OXZ plane, the longest sides of the resonator being oriented along the Z axis of the coil. The resonator is disposed at a distance h from the object to be analyzed PA. The resonator ER1 is split substantially in the middle of one of the two longer sides of the rectangular shape, for example the one furthest away from the object to be analyzed PA. The resonator may also be split substantially in the middle of both longer sides of the rectangular shape of the resonator.

Figure 10:
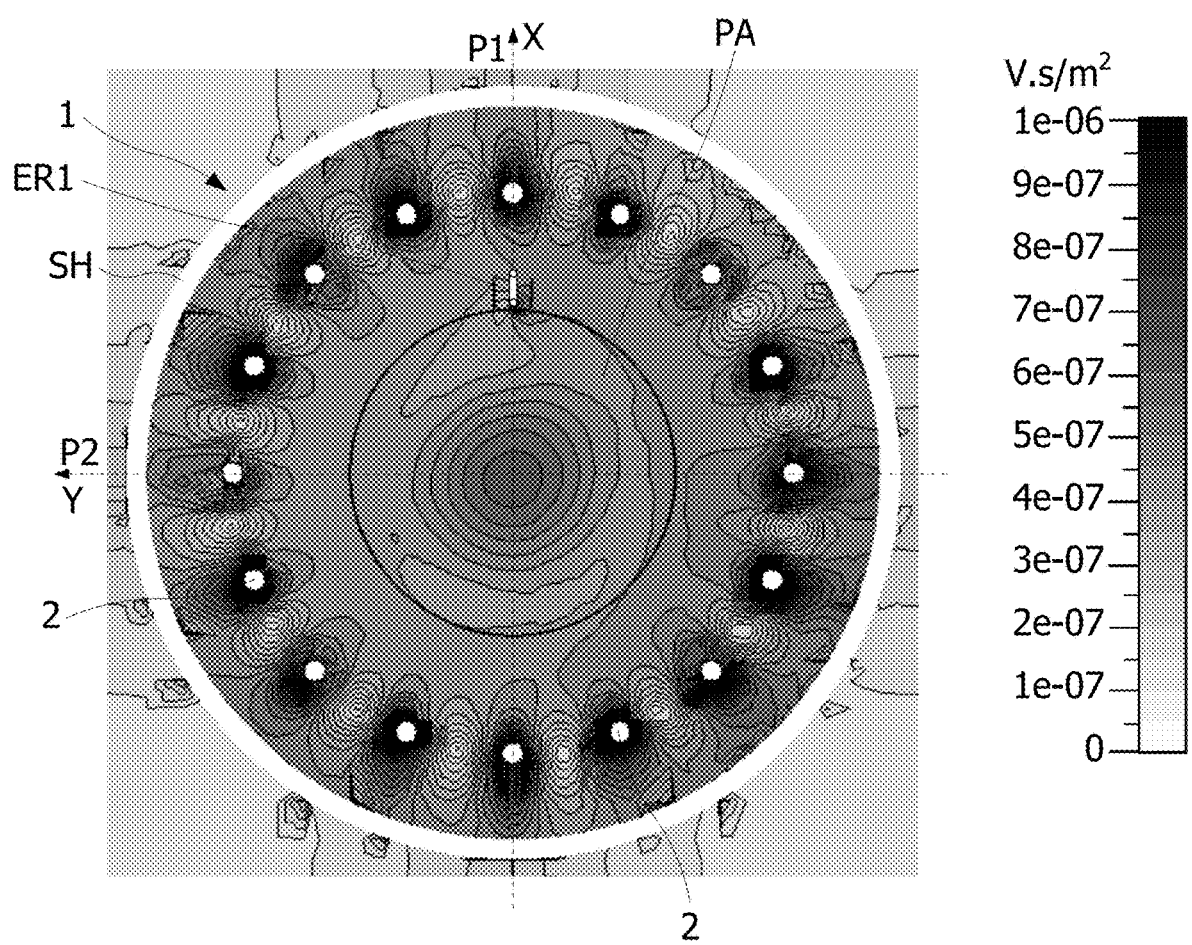
FIG. 10 is a cross-section image along a vertical plane of the distribution of the field B1 in the cage coil, in the presence of an object to be analyzed placed in the latter, and of the resonator of FIGS. 9A, 9B, FIGS. 11A, 11B schematically show the cage coil, respectively in axial view and in axial cross-section along a vertical plane, associated with a resonator according to another embodiment.

FIG. 10 represents an image of the distribution in the cage coil 1 of the component of the field B1 (in V·s/m²) measured to form MRI images, in the presence of an object to be analyzed PA placed therein, the resonator ER1 being placed in the cage coil 1 as shown in FIGS. 9A, 9B. With respect to FIG. 8A showing the distribution of the field B1 in the cage coil 1, without a resonator, FIG. 10 shows an increase of the field B1 in the right half of the coil (as seen in the figure), the resonator ER1 being located in the plane delimiting the right and left parts of the coil 1. In the example of FIG. 10, the resonator ER1 is realized using a conductor wire having a diameter of 1 mm (within ±10%) or a conductive track formed on an insulating substrate having a width of 1 mm (within ±20%). The ring formed by the resonator ER1 has a width equal to 3% (within ±20%) of the diameter of the coil 1, and a length equal to 90% of the length of the coil (within ±20%).

Figure 11A:
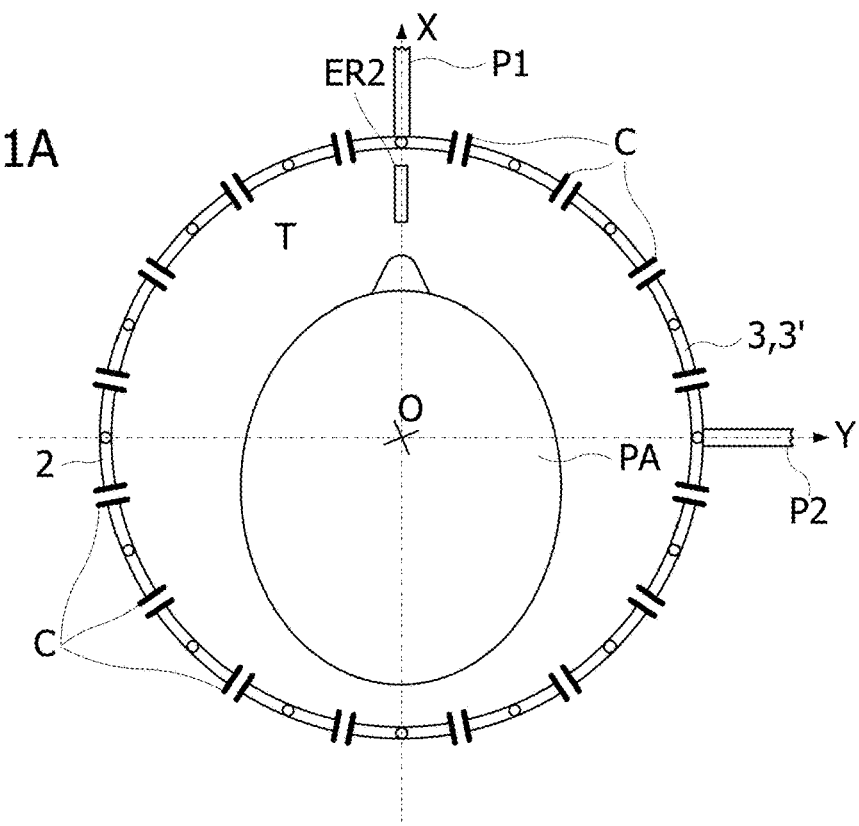
Figure 11B:
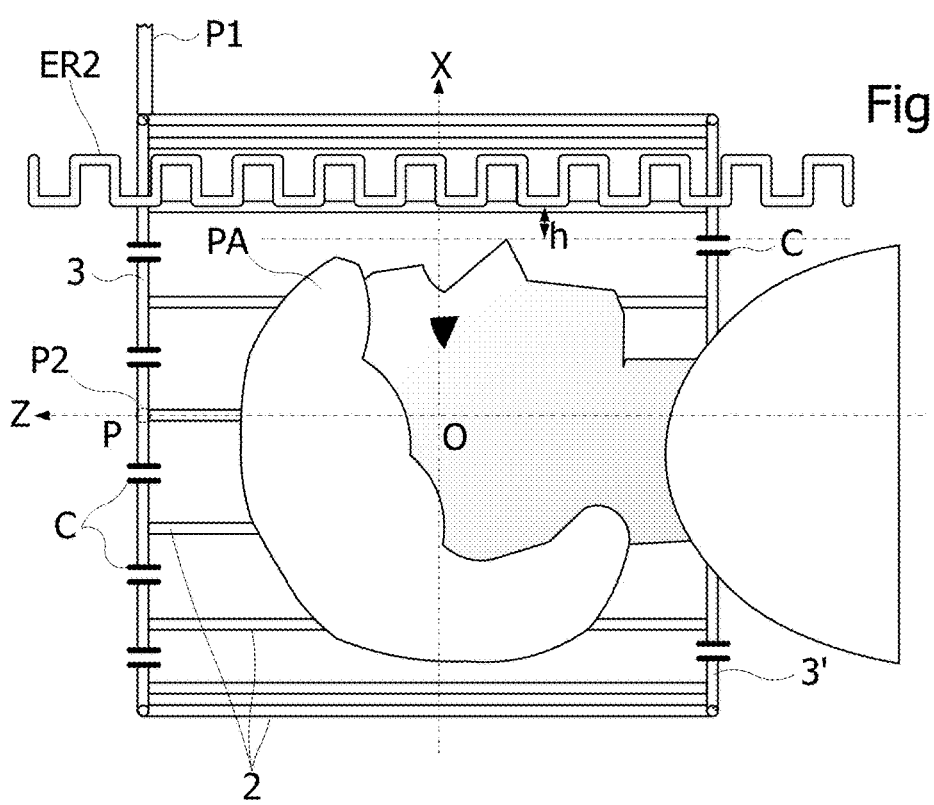

FIGS. 11A, 11B show the cage coil 1 associated with a resonator ER2 having a rod shaped in meanders or waves. The resonator ER2 is disposed in the coil 1 in the OXZ plane, the longest sides of the resonator being oriented along the Z axis of the coil. The resonator is disposed at a distance h from the object to be analyzed PA.

Figure 12:
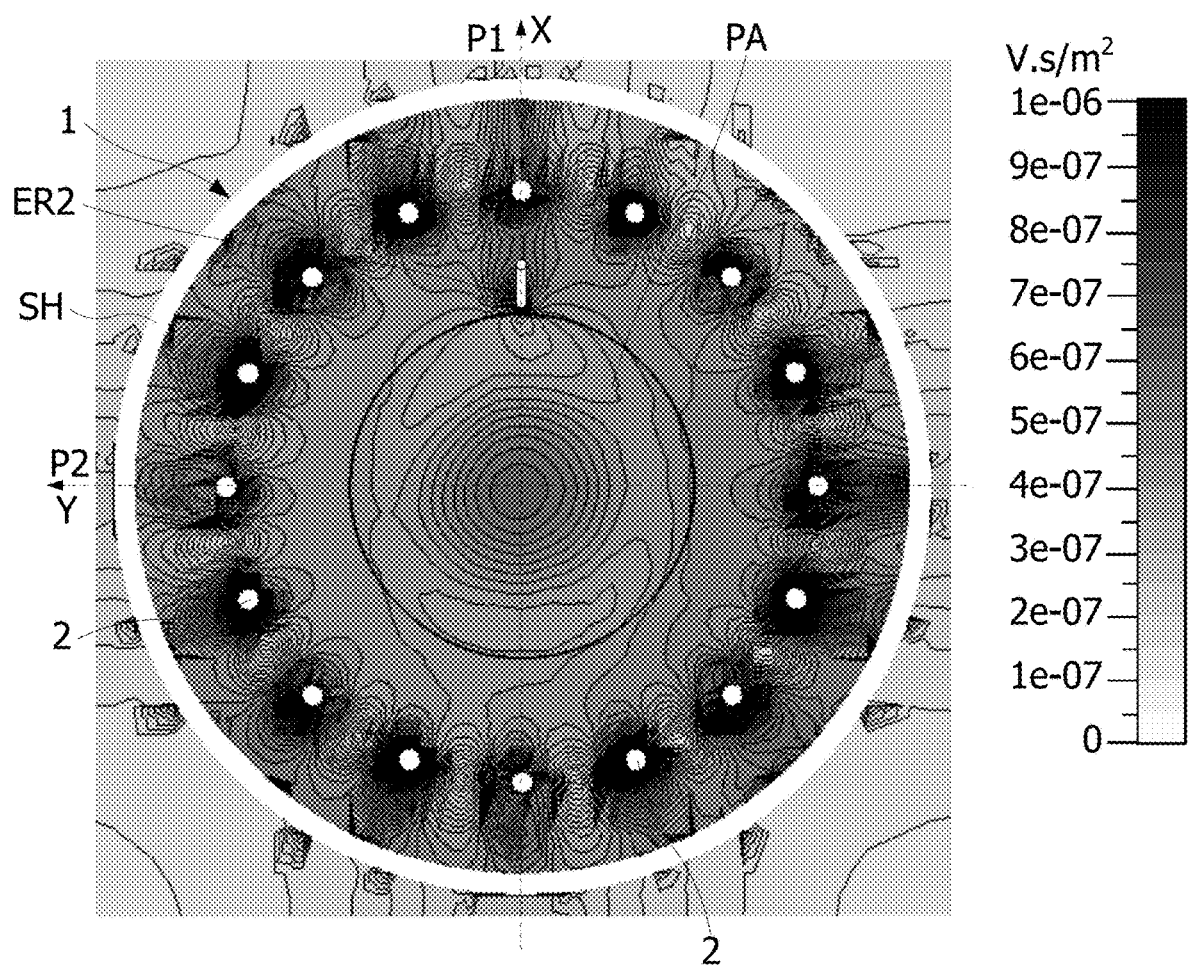
FIG. 12 is an image in axial cross-section along a vertical plane of the distribution of the field B1 in the cage coil, in the presence of an object to be analyzed placed in the latter, and of the resonator of FIGS. 11A, 11B.

FIG. 12 is an image of the distribution in the cage coil 1 of the component of the field B1 (in V·s/m²) measured to form MRI images, in the presence of an object to be analyzed PA placed therein, the cage coil being associated with the resonator ER2. With respect to the image of FIG. 8A showing the distribution of the field B1 in the cage coil 1, without a resonator, FIG. 12 shows a local increase of the field B1 between the resonator ER2 and the part of the coil nearest the resonator, and a local decrease of the field B1 in the object to be analyzed PA, in a region close to the location of the resonator ER2 and in the opposite region of the object PA (along the axis OX). A local increase of the field B1 in the object PA can also be observed in lateral regions (along the axis OY). In the example of FIG. 12, the resonator ER2 is produced using a conducting wire having a diameter of 1 mm (±20%) or a conductive track formed on an insulating substrate having a width of 1 mm (±20%). The resonator ER2 has a width and a meander width of 0.8% (within ±20%) of the inside diameter of the coil 1, and a length equal to one and a half times the length of the coil (±20%).

Figure 13:
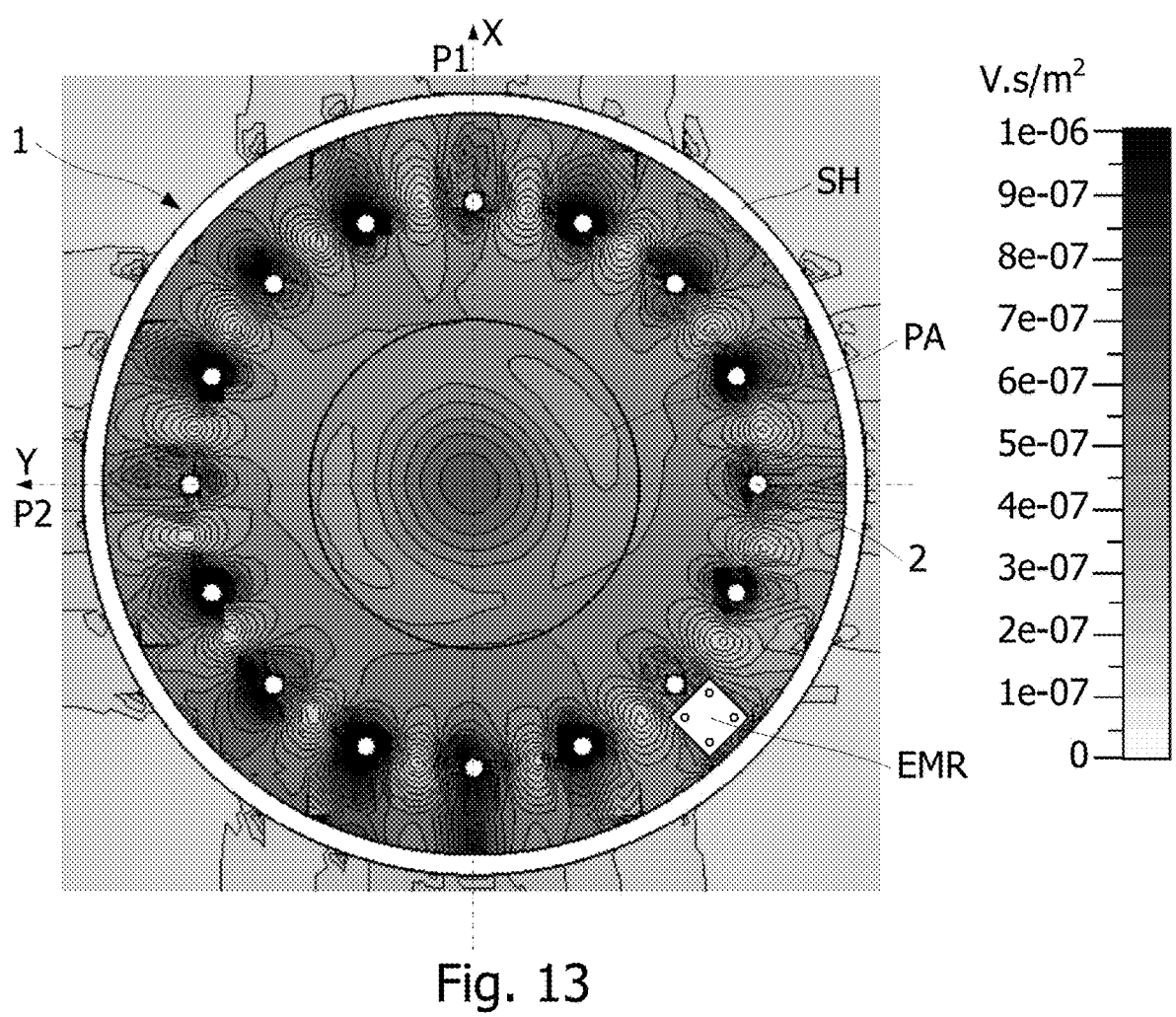
FIG. 13 is a cross-section image along a vertical plane of the distribution of the field B1 in the cage coil, in the presence of an object to be analyzed placed in the latter, with the resonator of FIG. 2A placed outside the coil, according to another embodiment, FIGS. 14 and 15 schematically show the cage coil, in axial view, associated with several resonators according to another embodiment.

FIG. 13 is an image of the distribution in the cage coil 1 of the component of the field B1 (in V·s/m²) in the presence of an object to be analyzed PA placed therein, the cage coil being associated with a four-rod resonator EMR (FIG. 2A), placed outside the coil (between the coil and a shield SH). In the example of FIG. 13, the resonator EMR is placed along an axis passing through the center O of the coil 1, oriented at an angle of +135° with respect to an origin defined by the axis OX. With respect to the image of FIG. 8B showing the distribution of the field B1 in the cage coil 1, without a resonator, FIG. 13A shows a slight local decrease of the field B1 in the object to be analyzed PA at the periphery thereof.

Figure 14:
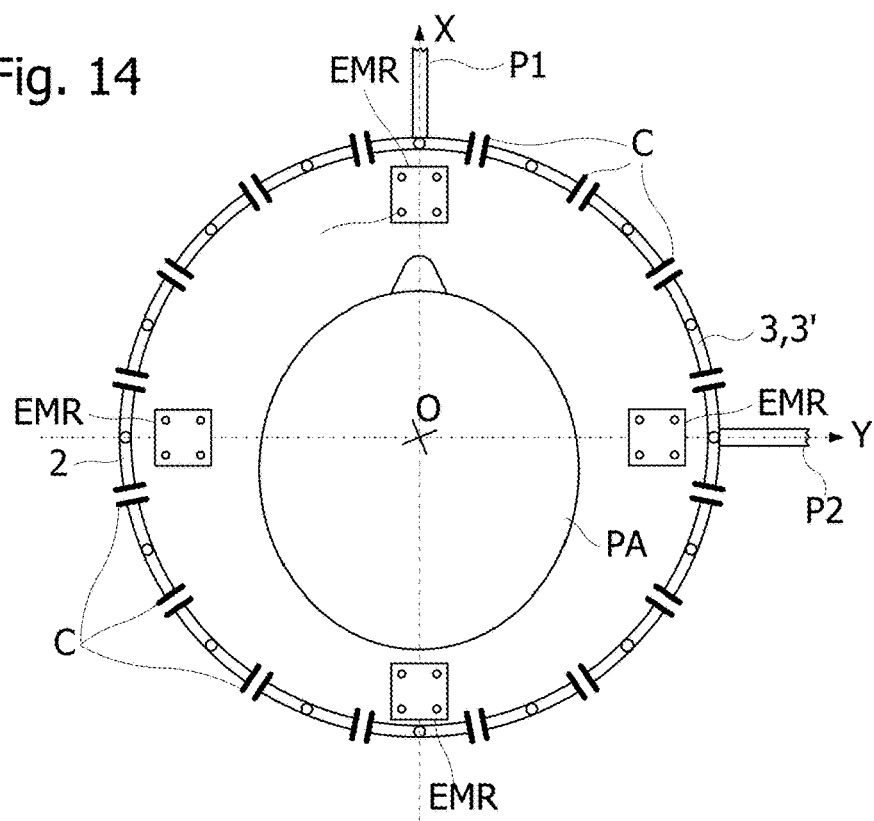
Figure 15:
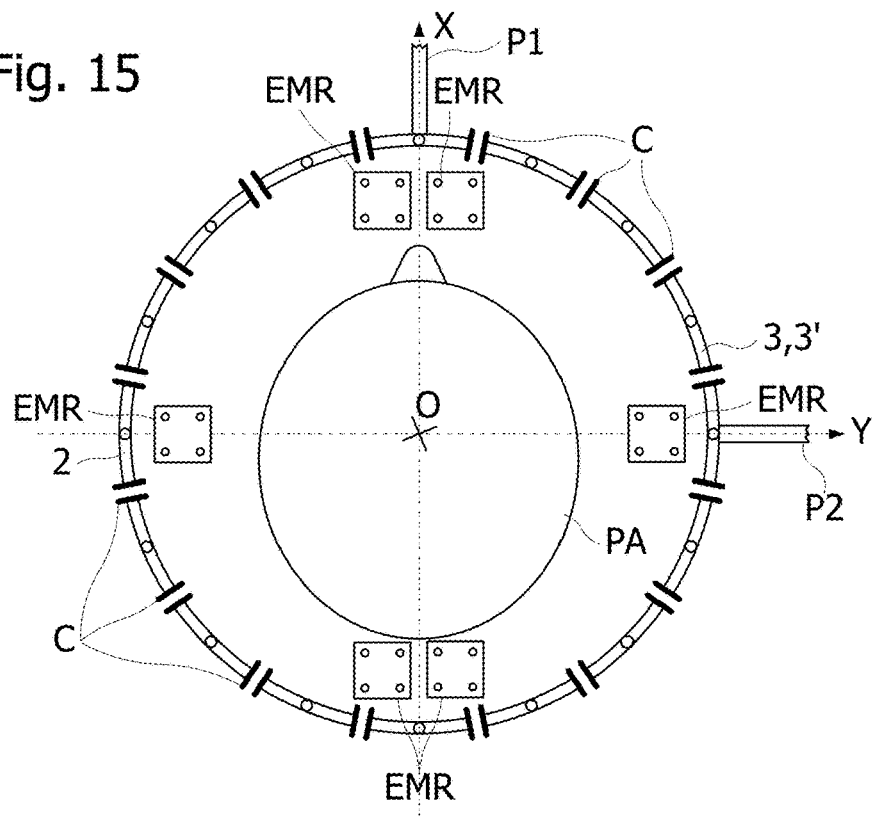

Other effects of local attenuation or local enhancement of the field B1 can be obtained by placing several resonators in and/or around the cage coil 1. Thus FIGS. 14 and 15 show the cage coil 1 and the object to be analyzed PA disposed in the coil. In FIG. 14, the coil 1 is associated with four resonators EMR, each with four rods T (FIG. 3A), placed in the coil, and oriented parallel to the longitudinal axis Z of the coil, namely two resonators respectively on either side of the object PA along the axis OX, and two resonators respectively on either side of the object PA along the axis OY.

In FIG. 15, the cage coil 1 is associated with six resonators EMR, each having four rods T (FIG. 3A), placed in the coil and oriented parallel to the longitudinal axis Z of the coil, namely two pairs of resonators respectively on either side of the object PA, along the axis OX, and two resonators respectively on either side of the object PA, along the axis OY.

LIST OF DOCUMENTS CITED

[1] "Quantitative assessment of the effects of high-permittivity pads in 7 Tesla MRI of the brain", W. M. Teeuwisse, et al, Magnetic Resonance in Medicine, May 2012, Vol. 67(5), p. 1285-1293

[2] "A theoretical approach based on electromagnetic scattering for analysing dielectric shimming in high-field MRI", W. M. Brink et al., Magnetic Resonance in Medicine, June 2015

[3] "Manipulation of image intensity distribution at 7.0 T: Passive RF shimming and focusing with dielectric materials", Q. X. Yang et al., JMRI, July 2006, Vol. 24(1), p. 197-202

[4] "Simulations of high permittivity materials for 7 T neuroimaging and evaluation of a new barium titanate-based dielectric", W. M. Teeuwisse et al., Magnetic Resonance in Medicine, April 2012, Vol. 67(4), p. 912-918

[5] Rupprecht et al., Proceedings ISMRM, 2013, p. 5458

The invention claimed is:

1. A method of controlling the distribution of a radiofrequency magnetic field in a magnetic resonance imaging system, comprising:
    disposing a cage coil in a permanent magnet providing a permanent magnetic field along a first axis;
    supplying the cage coil with a single radiofrequency signal so that it generates a radiofrequency magnetic field rotating in a plane perpendicular to the first axis; and
    placing an electromagnetic resonator at a position inside or outside the cage coil and at a distance from a region to be analyzed of an object to be arranged in the cage coil, the resonator being electrically connected to nowhere and having a resonance mode excited by the rotating magnetic field, the resonance mode and the position of the resonator relative to the cage coil being adapted to adjust the intensity of the rotating magnetic field in an area of the region to be analyzed.

2. The method of claim 1, wherein the resonance mode of the resonator is adapted by changing the structure, geometry or size of the resonator, or the nature of the materials forming the resonator.

3. The method of claim 1, wherein the resonator is configured to have a plurality of resonance modes.

4. The method of claim 1, wherein the resonator has one of the following configurations:
    the resonator is formed by a single rod arranged parallel to the first axis, the rod being rectilinear or folded so as to form meanders, or folded so as to form a rectangular loop, or
    the resonator comprises a plurality of parallel conductor rods distributed in a matrix configuration, the rods being embedded in a dielectric material and arranged parallel to the first axis and electromagnetically coupled together.

5. The method of claim 4, wherein the resonance mode of the resonator is adapted by adjusting the length of the resonator along the first axis or by changing the matrix configuration of the rods.

6. The method of claim 1, wherein the resonator is disposed in front of a supply port of the cage coil and configured to increase or decrease the rotating magnetic field locally in an area of the region to be analyzed close to the resonator or in an area of the region to be analyzed located opposite the resonator with respect to a center of the region to be analyzed.

7. The method of claim 1, further comprising:
    placing a plurality of electromagnetic resonators, each having a resonance mode excited by the rotating magnetic field, at respective positions inside or outside the cage coil and at said distance from the region to be analyzed, the resonance mode and the position of each of the resonators being adapted to adjust the intensity of the rotating magnetic field in an area of the region to be analyzed.

8. A coil system for a magnetic resonance imaging system, further comprising:
    a cage coil configured to receive a single radiofrequency signal for generating inside the cage coil a radiofrequency magnetic field rotating in a plane; and
    an electromagnetic resonator electrically connected to nowhere and having a resonance mode excited by the rotating magnetic field, the resonator being placed at a position inside or outside the cage coil and at a distance from a region to be analyzed of an object placed in the cage coil, the resonance mode and the position of the resonator relative to the cage coil being adapted to adjust the intensity of the rotating magnetic field in an area of the region to be analyzed.

9. The coil system of claim 8, wherein the resonator has one of the following configurations:
    the resonator has a periodic structure formed of a juxtaposition of elementary cells, each elementary cell including at least two different materials,
    the resonator includes a plurality of parallel conducting rods, distributed in an n×n matrix configuration, n being an integer greater than 0, and embedded in a dielectric material, the resonator being arranged inside or outside the cage coil so that the rods are perpendicular to the plane, or
    the resonator is formed by a single rod disposed perpendicular to the plane, the rod being rectilinear or folded so as to form meanders, or folded on itself so as to form an elongated loop extending perpendicular to the plane.

10. The coil system of claim 8, comprising a plurality of resonators disposed inside or outside the cage coil perpendicular to the plane.

11. The coil system of claim 10, wherein the resonator comprises 2×2 rods, the rods having a diameter between 0.2 and 1.2 mm, and being spaced apart by 1 to 3 cm, the resonator being located more than 2 cm from the region to be analyzed.

12. The coil system of claim 8, wherein the resonator is configured to have a resonance mode centered on a frequency of the rotating magnetic field.

13. The coil system of claim 8, in which the cage coil is a high-pass bird cage comprising 16 bars connecting two rings to each other, each ring segment between two bars of the two rings comprising a capacitor.

14. A magnetic resonance imaging system, comprising:
    a cage coil arranged in a permanent magnet providing a permanent magnetic field along a longitudinal axis of the cage coil, the cage coil being configured to receive a single radiofrequency signal for generating inside the cage coil a radiofrequency magnetic field rotating in a plane perpendicular to the longitudinal axis; and perpendicular to the longitudinal axis; and
    an electromagnetic resonator electrically connected to nowhere and having a resonance mode excited by the rotating magnetic field, the resonator being placed at a position inside or outside the cage coil and at a distance from a region to be analyzed of an object placed in the cage coil, the resonance mode and the position of the resonator relative to the cage coil being adapted to adjust the intensity of the rotating magnetic field in an area of the region to be analyzed.

15. The system of claim 14, wherein the permanent magnetic field produced by the permanent magnet is 7 T, the cage coil comprising bars interconnecting two rings, each ring segment of the two rings between two bars comprising a capacitor, the bars having a length between 23 and 27 cm, the rings of the cage coil having a diameter between 24 and 28 cm, and the capacitors having a capacitance between 2 and 6 pF.

16. The system of claim 14, wherein the resonator has one of the following configurations:
   the resonator has a periodic structure formed of a juxtaposition of elementary cells, each elementary cell including at least two different materials,
   the resonator includes a plurality of parallel conducting rods, distributed in an n×n matrix configuration, n being an integer greater than 0, and embedded in a dielectric material, the resonator being arranged inside or outside the cage coil so that the rods are perpendicular to the plane, or
   the resonator is formed by a single rod disposed perpendicular to the plane, the rod being rectilinear or folded so as to form meanders, or folded on itself so as to form an elongated loop extending perpendicular to the plane.

17. The system of claim 14, further comprising:
   a plurality of resonators disposed inside or outside the cage coil perpendicular to the plane.

18. The system of claim 17, wherein the resonator comprises 2×2 rods, the rods having a diameter between 0.2 and 1.2 mm, and being spaced apart by 1 to 3 cm, the resonator being located more than 2 cm from the region to be analyzed.

19. The system of claim 14, wherein the resonator is configured to have a resonance mode centered on a frequency of the rotating magnetic field.

20. The system of claim 14, wherein the cages coil is a high-pass bird cage comprising 16 bars connecting two rings to each other, each ring segment between two bars of the two rings comprising a capacitor.

* * * * *